(12) United States Patent
Steele et al.

(10) Patent No.: US 8,530,853 B2
(45) Date of Patent: Sep. 10, 2013

(54) CHARGED PARTICLE SOURCE FROM A PHOTOIONIZED COLD ATOM BEAM

(75) Inventors: Adam V. Steele, Rockville, MD (US); Brenton J. Knuffman, Montgomery Village, MD (US); Jabez J. McClelland, Bethesda, MD (US)

(73) Assignee: The United States of America, as represented by the Secretary of Commerce, NIST, Washington, DC (US)

( * ) Notice: Subject to any disclaimer, the term of this patent is extended or adjusted under 35 U.S.C. 154(b) by 0 days.

(21) Appl. No.: 13/369,008

(22) Filed: Feb. 8, 2012

(65) Prior Publication Data
US 2012/0145919 A1    Jun. 14, 2012

Related U.S. Application Data

(60) Provisional application No. 61/510,517, filed on Jul. 22, 2011.

(51) Int. Cl.
*H01J 27/24* (2006.01)

(52) U.S. Cl.
USPC .......... 250/423 P; 250/251; 250/396 R; 250/423 R; 250/424

(58) Field of Classification Search
USPC .......... 250/251, 396 R, 423 R, 424, 423 P, 250/423 F, 491
See application file for complete search history.

(56) References Cited

U.S. PATENT DOCUMENTS

| | | |
|---|---|---|
| 7,709,807 B2 | 5/2010 | McClelland et al. |
| 2008/0296483 A1 * | 12/2008 | McClelland et al. ......... 250/251 |

OTHER PUBLICATIONS

Z. T. Lu, K. L. Corwin, J. J. Renn, M. H. Anderson, E. A., Cornell, and C. E. Wieman; "Low-Velocity Intense Source of Atoms from a Magneto-optical Trap"; Phys. Rev. Lett. 77, 3331 (1996).
K. Dieckmann, F. J. C. Spreeuw, M. Weidemuller, and J. T. M. Walraven; "Two-dimensional magneto-optical trap as a source of slow atoms"; Phys. Rev. A 58, 3891 (1998).
S. Chu, J.E. Bjorkholm, A. Ashkin, and A. Cable; "Experimental Observation of Optically Trapped Atoms"; Phys. Rev. Lett. 57, 314 (1986).
C. Slowe, L. Vernac, and L.V. Hau; "A High Flux Source of Cold Rubidium"; Rev. Sci. Instrum. 76, 103101 (2005).
W.D. Phillips and H. Metcalf; "Laser cooling and electromagnetic trapping of neutral atoms"; Phys. Rev. Lett. 48, 596 (1982).
W. G. Kaenders, F. Lison, I. Muller, A. Richter, R. Wynands, and D. Meschede; "Refractive components for magnetic atom optics"; Phys. Rev. A 54, 5067 (1996).

(Continued)

*Primary Examiner* — Michael Logie
(74) *Attorney, Agent, or Firm* — Daphne Burton; Burton IP Law Group

(57) ABSTRACT

A system for producing a charged particle beam from a photoionized cold atom beam. A vapor of neutral atoms is generated. From these atoms, an atom beam having axial and transverse velocity distributions controlled by the application of laser light is produced. The produced atom beam is spatially compressed along each transverse axis, thus reducing the cross-sectional area of the produced beam and reducing a velocity spread of the produced beam along directions transverse to the beam's direction of propagation. Laser light is directed onto at least a portion of the neutral atoms in the atom beam, thereby producing ions and electrons. An electric field is generated at the location of the produced ions and electrons, thereby producing a beam of ions traveling in a first direction and electrons traveling in substantially the opposite direction. A vacuum chamber contains the atom beam, the ion beam and the electron beam.

20 Claims, 4 Drawing Sheets

(56) References Cited

OTHER PUBLICATIONS

J. E. Bjorkholm, R. R. Freeman, A. Ashkin, and D. B. Pearson; "Observation of Focusing of Neutral Atoms by the Dipole Forces of Resonance-Radiation Pressure"; Phys. Rev. Lett. 41, 1361 (1978).

B. Knuffman, A. V. Steele, J. Orloff and J. J. McClelland, "Nanoscale focused ion beam from laser-cooled lithium atoms"; New Journal of Physics 13, 103035 (2011).

S. B. van der Geer, M. P. Reijnders, M. J. de Loos, E. J. D. Vredenbregt, P. H. A. Mutsaers, and O. J. Luiten; "Simulated performance of an ultracold ion source"; J. Appl. Phys. 102, 094312 (2007).

B. G. Freinkman, A. V. Eletskii, and S. I. Zaitsev; "A proposed laser source of ions for nanotechnology"; . Microelectronic Engineering 73-74, 139-143 (2004).

B. J. Claessens, S.B. van der Geer, G. Taban, E. J. D. Vredenbregt and O.J. Luiten; "Ultracold Electron Source"; Phys. Rev. Lett. 95, 164801 (2005).

W.D. Phillips and H. Metcalf; "Laser deceleration of an atomic beam"; Phys. Rev. Lett. 48, 596 (1982).

B. G. Freinkman, A. V. Eletskii, and S. I. Zaitsev; "A proposed laser source of ions for nanotechnology"; Microelectronic Engineering 73-74, 139-143 (2004).

* cited by examiner

CHARGED PARTICLE SOURCE FROM A PHOTOIONIZED COLD ATOM BEAM

CROSS-REFERENCE TO RELATED APPLICATIONS

The present application claims priority to provisional application Ser. No. 61/510,517, filed on or about Jul. 22, 2011, entitled "Cold Atom Beam Charged Particle Source" naming the same inventors as in the present application. The contents of this provisional application are incorporated by reference, the same as if fully set forth.

STATEMENT REGARDING FEDERALLY SPONSORED RESEARCH/DEVELOPMENT

The subject matter of this patent application was invented under the support of at least one United States Government contract. Accordingly, the United States Government may manufacture and use the invention for governmental purposes without the payment of any royalties.

BACKGROUND OF THE INVENTION

1. Field of Invention

The present disclosure relates to charged particle sources and, more particularly, to a charged particle source created by photoionizing an atom beam of laser-cooled atoms in an electric field.

2. Description of Related Art

Low emittance, high brightness charged particle beams suitable for focusing to the nanoscale have applications in a wide variety of areas. These areas include surface analysis, microscopy and surface modification.

A liquid metal ion source (LMIS) may be used for creating ion beams. Such beams are well-developed and perceived as reliable. When used in conjunction with an ion optical column, focused ion beams (FIBs) incorporating an LMIS may form a probe of a few nanometers in diameter. The focused probe may be formed when ions produced by the LMIS are accelerated to the desired energy and then focused onto a target. As the focused probe is rastered over the target secondary electrons, secondary ions or backscattered ions may be collected in order to form an image. The focused probe can also be used to modify a surface, for example, by removing material through sputtering. However, FIBs which employ these LMIS sources may offer larger spot size or lower currents than may be desirable for such applications.

There is a need for an ion source with higher brightness and lower energy spread than an LMIS.

More recently, charged particle sources based on photoionization of a confined, laser-cooled cold gas of atoms have become available. The magneto-optical trap ion source (MOTIS) is an example of such a charged particle source. When compared to LMIS-based FIBs, the MOTIS appears to offer some advantages. The MOTIS may be integrated with a commercial focused ion beam column, and may demonstrate beam currents and small spot sizes at e.g., 2 kilo-electron volts (keV) beam energy, which are substantially similar to LMIS-based FIBs. Also, the MOTIS-based FIB system may offer access to beams with atomic species not compatible with the LMIS. However, the MOTIS-based system may have a maximum brightness which is limited by diffusion of neutral atoms into the ionization volume.

Diffusion may not be an issue with some ion sources produced by laser-cooling. For example, a thermal source may have an, on-axis oven that produces an unslowed atom beam. The output may be laser collimated, cooled along the two directions transverse to the atom beam's velocity, and then photoionized. Low chromatic spread may be possible in such a beam. This and subsequent proposals involve atom beams with large axial velocities and velocity spreads characteristic of thermal sources. They do not address major issues involved with efficiently converting an atom beam into a charged particle beam while achieving high beam brightness. Cooling atoms to very low temperatures in convenient distances and ionizing atoms efficiently with available laser power may be problematic in beams with large axial velocities due to the small interaction times with the corresponding lasers. Additionally, the coupling of energy between axial and transverse degrees of freedom in beams with a large axial velocity spread makes maintaining low transverse temperatures in the ion beam difficult.

Accordingly, in order to produce beams with brightness greater than the LMIS and suitable for demanding focused charged particle beam applications there is yet further a need for a new charged particle source which addresses the problems associated with previous on-axis oven-based designs. The charged particle source should still have a low energy spread.

BRIEF SUMMARY OF DISCLOSURE

The present disclosure addresses the needs described above by providing a system and method for the creation of low emittance, high brightness ion and electron beams suitable for focusing to the nanoscale. The system and method provide charged particles from a photoionized cold atom beam. In accordance with one embodiment of the present disclosure, the system comprises an atomic vapor source configured to generate a vapor of neutral atoms. The system also comprises a beam formation subsystem configured to receive atoms from the atomic vapor source and to produce an atom beam that includes said received atoms, said beam formation subsystem being further configured to control axial and transverse velocity distributions of the produced atom beam.

The system further comprises a beam compression subsystem configured to receive the produced atom beam and to spatially compress said beam along each transverse axis in order to reduce the cross-sectional area of said produced beam and to reduce a velocity spread of said produced beam along directions transverse to the beam's direction of propagation.

The system still further comprises a photoionization subsystem configured to receive neutral atoms from the compressed atom beam and to direct at least one beam of laser light onto at least a portion of the neutral atoms in the compressed atom beam, thereby producing ions and electrons.

Also included within the system is an extraction subsystem configured to generate an electric field at the location of the produced ions and electrons, thereby producing an ion beam propagating in a first direction and an electron beam propagating in substantially the opposite direction.

Finally, the system comprises a vacuum chamber evacuated to less than about $10^{-6}$ millibar, said vacuum chamber configured to contain at least the produced atom beam, the compressed atom beam, the ion beam and the electron beam.

In another embodiment of the present disclosure, a method is provided for producing a charged particle source from a photoionized cold atom beam. The method comprises the step of generating a vapor of neutral atoms. The method also comprises the step of receiving atoms from the atomic vapor source, producing an atom beam that includes said received atoms, and controlling axial and transverse velocity distributions of the produced atom beam.

The method further comprises the step of evacuating a vacuum chamber to less than about $10^{-6}$ millibar, said vacuum chamber configured to contain at least the produced atom beam, the compressed atom beam, the ion beam and the electron beam. The method. still further comprises the step of receiving the produced atom beam and spatially compressing said beam along each transverse axis in order to reduce the cross-sectional area of said produced beam and to reduce a velocity spread of said produced beam along directions transverse to the beam's direction of propagation.

In addition, the method comprises the step of receiving neutral atoms from the beam compression subsystem and directing at least one beam of laser light onto at least a portion of the neutral atoms in the atom beam, thereby producing ions and electrons. Finally, the method comprises generating an electric field at the location of the produced ions and electrons, thereby producing a beam of ions traveling in a first direction and a beam of electrons traveling in substantially the opposite direction.

In yet another embodiment of the present disclosure, a method is provided for aligning the axis of an atom beam with the orientation of an electric field at a particular location within an enclosure for use in creating a charged particle source by photoionizing a cold atom beam. The method comprises providing an atom beam in the enclosure, and providing a plurality of electrically conductive devices in said enclosure.

The method further comprises evacuating the enclosure to a pressure below about $10^{-6}$ millibar, and applying at least one voltage to the plurality of electrically conductive devices. The method still further comprises tilting the portion of the enclosure providing the atom beam with respect to the portion of the enclosure having the electrically conductive devices until the atom beam is substantially aligned with the electric field produced by the at least one voltage on the electrically conductive devices.

In yet another embodiment of the present disclosure, a method is provided for aligning the axis of an atom beam with the orientation of an electric field at a particular location within an enclosure for use in creating charged particles by photoionizing a cold atom beam. The method comprises providing an atom beam in the enclosure. The method further includes providing a plurality of electrically conductive devices, evacuating the enclosure to a pressure below about $10^{-6}$ millibar, and applying at least one laser beam to the atom beam. Finally, the method comprises causing a deflection of the atom beam, thus substantially aligning the atom beam axis with the electric field produced by the electrodes.

In another embodiment of the present disclosure, a system is provided for producing a charged particle beam from a photoionized cold atom beam. The system comprises an atomic vapor source configured to produce a vapor of neutral atoms; and a beam formation subsystem having one or two apertures, said one or two apertures having a size and location with respect to the atomic vapor source that is configured to selectively eliminate atoms from the atomic vapor having a transverse velocity above a chosen threshold with respect to the atom beam axis. The system also includes a beam compression subsystem configured to receive the produced atom beam and to spatially compress said beam along each transverse axis in order to reduce the cross-sectional area of said produced beam and to reduce a velocity spread of said produced beam along directions transverse to the beam's direction of propagation.

The system further includes a photoionization subsystem configured to receive neutral atoms from the compressed atom beam and to direct at least one beam of laser light onto at least a portion of the neutral atoms in the compressed atom beam, thereby producing ions and electrons, wherein at least one of the at least one laser beam of light has a frequency and orientation configured to excite a group atoms in the atom beam within a predetermined axial velocity band. The system yet further includes an extraction subsystem configured to generate an electric field at the location of the produced ions and electrons, thereby producing an ion beam propagating in a first direction and an electron beam propagating in substantially the opposite direction. The system also includes a vacuum chamber evacuated to less than about $10^{-6}$ millibar, said vacuum chamber configured to contain at least the produced atom beam, the compressed atom beam, the ion beam and the electron beam.

These, as well as other objects, features and benefits will now become clear from a review of the following detailed description of illustrative embodiments and the accompanying drawings.

DETAILED DESCRIPTION OF THE DISCLOSURE

A system and method are described for creating a charged particle beam from a photoionized cold atom beam. The system and method may be used to create a low emittance, high brightness charged particle beam suitable for focusing to the nanoscale. The system and method may be compatible with any atomic species amenable to laser cooling. The system and method may be used to achieve a high ionization probability of the atom beam and suppression of the coupling between the axial spread velocity in the neutral beam and transverse velocity spread in the charged particle beam. The brightness of a charged particle beam produced by the system and method may depend on the neutral atom chosen.

In addition to the method for creating a charged particle beam from a photoionized cold atom beam, also described herein is a method for aligning an atom beam axis and electric field in an extraction system. This method may be useful in all systems in which a high brightness charged particle beam is produced by photoionizing a cold atom beam in the presence of an electric field.

Figure 1:
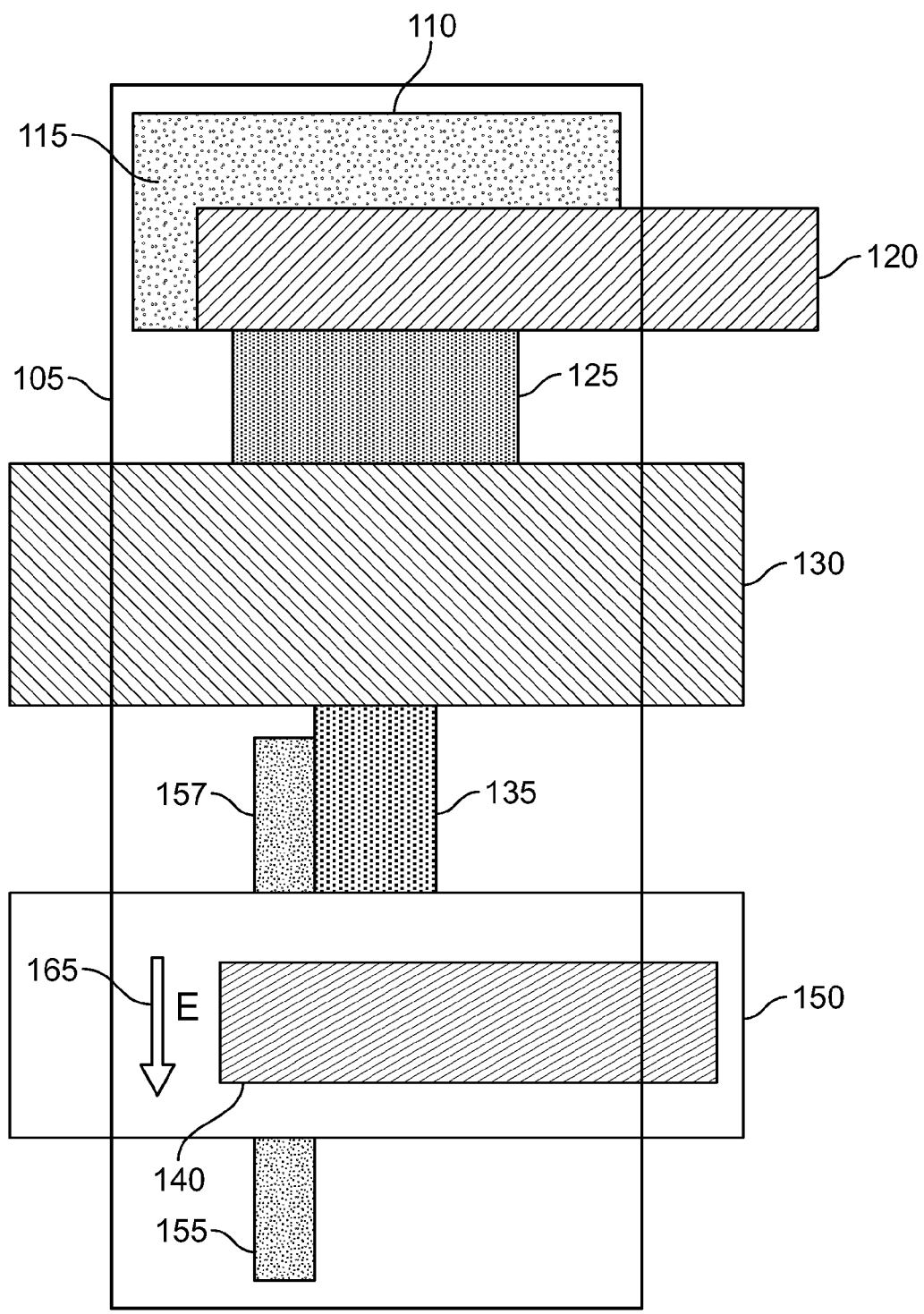
FIG. 1 is a system for use in creating a charged particle beam by photoionizing a cold atom beam.

Referring now to FIG. 1, the system for creating a charged particle beam from a photoionized cold atom beam may be contained within a vacuum chamber evacuated to below $10^{-6}$ millibar (mbar). The actual pressure required may depend on the particular implementation.

The system may also incorporate an atomic vapor source 110 to produce gaseous atoms 115. Potential atomic vapor sources include effusive ovens, getters or gas and liquid reservoirs. The atomic vapor source 110 may produce gaseous atoms from a heated crucible or other container filled with an elemental sample of the type desired in the ion beam. The elemental sample may be in solid or liquid form at room temperature. The type of atom included within the elemental sample includes, but is not necessarily limited to, lithium (Li), sodium (Na), potassium (K), rubidium (Rb), cesium (Cs), francium (Fr), magnesium (Mg), calcium (Ca), strontium (Sr), barium (Ba), chromium (Cr), silver (Ag), erbium (Er), silicon (Si), phosphorus (P), antimony (Sb), neon (Ne), argon (Ar), krypton (Kr), and xenon (Xe) atoms.

In lieu of a crucible, the atomic vapor source 110 may be a cooled vessel attached to a nozzle. Gaseous atoms 115 may be produced through the nozzle at a controllable flow rate. A direct current discharge may be produced within the nozzle in order to create metastable gas. The cooled vessel and nozzle embodiment may be desirable when the ion source is a noble gas such as neon (Ne), argon (Ar), krypton (Kr) or xenon (Xe).

In addition to the atomic vapor source 110, the system for creating a charged particle beam may also include four subsystems: (1) a beam formation subsystem 120; (2) a beam compression subsystem 130; (3) a photoionization subsystem 140; and (4) an extraction subsystem 150. These four subsystems may operate to convert the gaseous atoms 115 into a beam of charged particles. Subsystems 120, 130, 140 and 150 may lie inside, outside or partially inside or outside the vacuum chamber 105. However, it may be desirable to contain the produced atom beam 125 (i.e., the beam produced by the beam formation subsystem), the compressed atom beam 135, the ion beam 155 and electron beam 157 within the vacuum chamber 105 at all times as shown in FIG. 1.

The resulting ion beam 155 and electron beam 157 produced by the extraction subsystem 150 may have performance characteristics designed to enable high resolution probe formation and beam currents sufficiently large to acquire images or modify surfaces in a reasonable length of time when compared to prior art technology such as liquid metal ion sources. In addition, elements that create electric or magnetic fields for manipulating the atoms or ions and electrons can be located inside or outside or partially inside and outside the vacuum chamber.

The present system for creating a charged particle beam as described herein has a number of notable features. For example, the beam formation subsystem 120 may produce an atom beam 125 having a high atomic flux, e.g., greater than $10^9$ atoms per second. The produced atom beam 125 may also have a low beam velocity, e.g., less than one hundred (100) meters per second for many atoms. In addition, the produced atom beam 125 may have a low axial velocity spread, e.g., a full width half maximum (FWHM) of less than one-half the thermal FWHM of the atom source.

Another notable feature is that the beam compression subsystem 130 may compress the cross-sectional area of the produced atom beam 125 by a factor of 100 or more, thus creating the compressed atom beam 135. It may also cool the transverse temperature of the beam to below the Doppler limit for many atoms.

Other notable features may be associated with the photoionization subsystem 140, which may efficiently ionize a large fraction of the beam atoms—e.g., greater than ten percent (10%)—to create ions and electrons.

In addition, the present system may include an extraction subsystem 150. This subsystem may create an electric field 165 in the volume occupied by the charged particles to accelerate them in a desired direction.

Gaseous atoms 115 may be produced by the atomic vapor source 110 and provided to the beam formation subsystem 120, where a beam of neutral atoms may be formed and the velocity characteristics of the beam may be controlled. Gaseous atoms 115 may be directed toward a region of space where they may be cooled with laser light. Along the two transverse axes, the gaseous atoms may be laser cooled. Along the third or axial direction, the gaseous atoms may also be laser cooled.

The constituent atoms in the produced atom beam 125 may have a reduced average speed along the beam's propagation direction (or the beam axis) as compared to the mean speed of the atoms produced by the vapor source 110. The standard deviation of the velocity of the beam's atoms along this axis may also be less than that of the gaseous atoms 115 produced by the vapor source 110. Also, the standard deviation of the velocity of the beam atoms along the two directions (or the transverse axis) orthogonal to the beam axis may be less than the mean speed of atoms along the beam axis. The output axial speed of atoms may be controlled through an appropriate configuration of lasers and magnetic fields. The beam formation subsystem 120 may include a laser beam configured at a non-normal angle relative to the atom beam. The frequency and intensity of the laser beam may be suitable to apply velocity-dependent radiation pressure to a portion of the atoms in the beam.

The beam formation subsystem 120 may have one or more apertures (not shown). The size and relative location of the aperture(s) with respect to the atomic vapor source may be designed to selectively eliminate certain atoms from the gaseous atoms produced by the atomic vapor source. These select atoms may be eliminated where their transverse velocity with respect to the atom beam axis divided by their axial velocity rises above a chosen threshold. In this case, the axial velocity profile of the resultant atom beam 125 may be substantially the same as that of the vapor source 110. Modification or control of the axial velocity profile may occur as a result of the action of other elements comprising the beam formation subsystem 120 before entering the beam compression subsystem 130; this is not strictly required as in the case where the photoionization subsystem 140 is designed to select a portion of atoms in the beam 135 with a reduced axial velocity spread for conversion into charged particles..

The beam formation subsystem 120 may include a number of elements designed to take the atoms 115 released by the atomic vapor source 110, then do the initial cooling, and subsequently emit a beam 125 with large number of atoms per unit time (>$10^9$ atoms per second). For example, one embodiment may be a low-velocity intense source (LVIS) such as that described in the article by Z. T. Lu et al. titled "Low Velocity Intense Source of Atoms from a Magneto-Optical Trap", Phys. Rev. Lett. 77, 3331(1996).

Another potential embodiment of the beam formation subsystem 120 may be a Zeeman slower coupled with a laser collimator such as that described by C. Slowe, et al, "High flux source of cold rubidium atoms", Review of Scientific Instruments. 77, 103101 (2005). The Zeeman slower may also include a pump laser that may be directed onto the received beam in the direction opposite to the beam's motion.

A magnetic field may be produced by the Zeeman slower by way of, e. g, a coil, and the velocity of the beam may be reduced along its direction of propagation.

Another potential embodiment for the beam formation subsystem 120 is a two-dimensional magneto-optical trap such as that described by K. Dieckmann et al, in "Two Dimensional Magneto-Optical Trap as a Source of Slow Atoms," Phys. Rev. A 58, 3891 (1998).

Figure 2A:
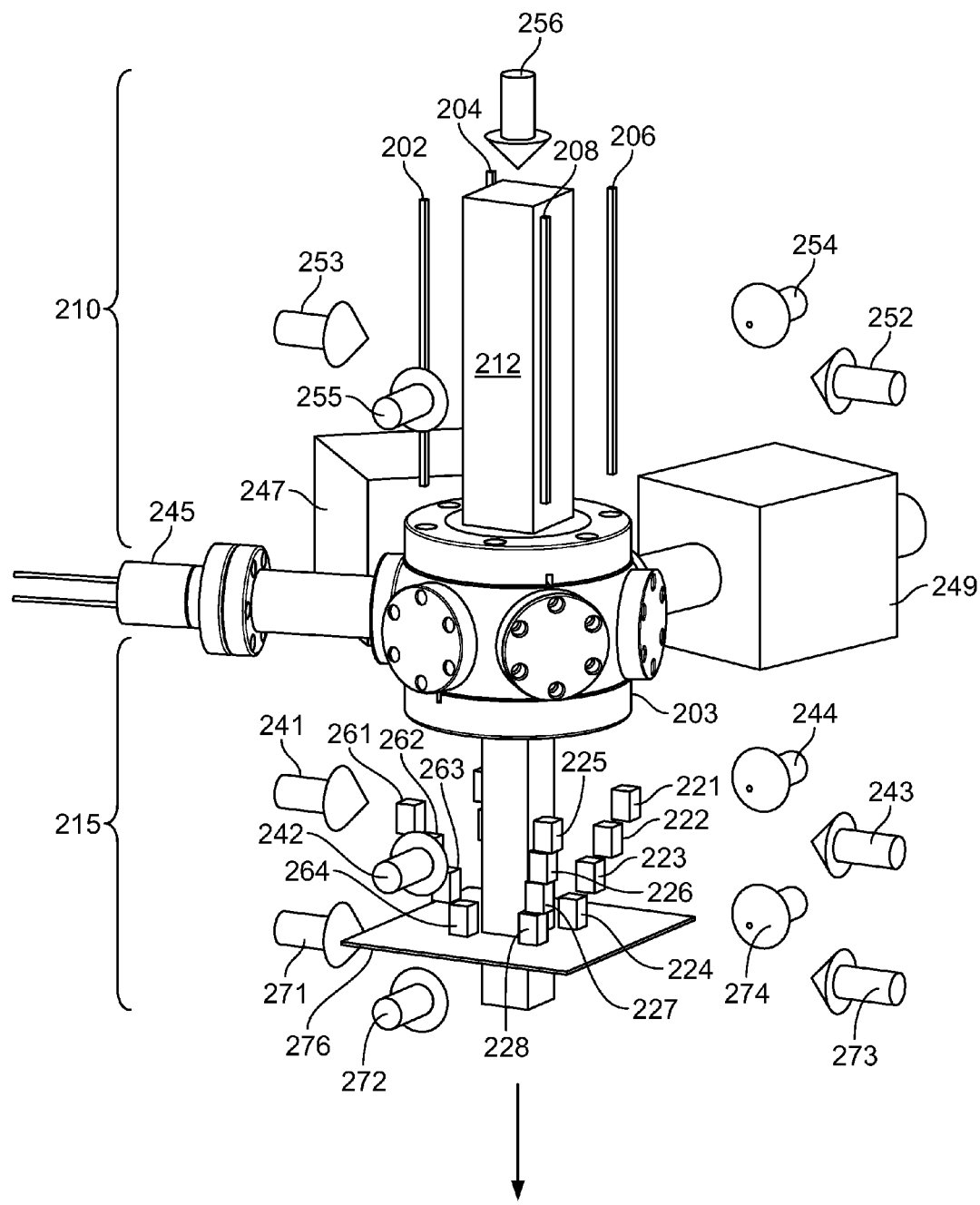
FIG. 2A illustrates a beam formation subsystem that includes a two-dimensional magneto-optical trap and a beam compression subsystem that includes a magneto-optic compressor in accordance with one embodiment of the present disclosure.

Referring now to FIG. 2A, illustrated is an embodiment of the beam formation subsystem 210 that includes a two-dimensional magneto-optical trap. The two-dimensional magneto-optical trap may have an extra laser beam 256 or pair of laser beams. The magnetic field gradient for the magneto-optical trap may be above 1 Gauss per centimeter (G/cm) along the two transverse axes, and a weaker or non-existent gradient along the axial direction. The gradients may be generated by a set of four permanent magnets 202, 204, 206, 208. The spacing between the magnets and the strength of the magnets may be chosen to give a desired field gradient.

Two pairs of counter-propagating laser beams 252, 253, 254, 255 that are tuned below a strong atomic resonance may create a magneto-optical trap near the center of a quadrupole field. Appropriate circular polarization may be needed for this to occur.

In addition to the two pairs of counter-propagating laser beams, the two dimensional magneto-optical trap may include a fifth laser beam 256. The fifth laser beam 256 (which may also be known as a pusher beam) may be oriented orthogonally to the other two pairs, along the center of the quadrupole field and along the atom beam axis. At the opposite end of the magneto-optical trap region, a mirror (not shown) may be placed with a hole disposed therethrough. The mirror may retro-reflect the pusher beam back through the trap to form a counterpropagating pair of laser beams. The mirror may incorporate a phase-retarding waveplate to define the polarization of the retro-reflected beam.

The atomic vapor source 245 may create a background pressure (between $10^{-8}$ mbar and $2 \times 10^{-6}$ mbar) of vapor which may fill the region 212 contained within the vacuum chamber 203 where the lasers intersect. This region may also be called the trapping region. A fraction of the atoms in the background pressure passing through the trapping region may be cooled, and drawn towards the center of the quadrupole field. If a retro-reflecting mirror is used, then the atoms may be expelled through the hole in the retro-reflecting mirror. The expelled atoms may form a beam which may be directed from the beam formation subsystem 210 towards the second subsystem, the beam compression subsystem 215. The beam may have an axial velocity that can be changed by adjusting the intensity, polarization, and wavelength of the pusher beam. Situated between the beam formation subsystem 210 and the beam compression subsystem 215 are atomic vapor source 245 and ion pumps 247, 249.

From the two: dimensional magneto-optical trap 210 or other embodiments that may comprise the beam formation subsystem, the cooled atoms may be transported by their own residual velocity along the axial direction to the beam compression subsystem 215. In this embodiment, the beam compression subsystem includes a magneto-optical compressor 220 and laser beams 241, 242, 243, 244. The beam compression subsystem further includes a first set of magnets 221, 222, 223, 224, a second set of magnets 225, 226, 227, 228, a third set of magnets 261, 262, 263, 264 and a fourth set of four magnets (hidden). The beam compression subsystem further includes optical molasses having laser beams 271, 272, 273, 274 and magnetic shield 276.

At the beam compression subsystem 215, the atom beam is received from the beam formation subsystem 210, and then spatially compressed along the two transverse directions to create an output beam with a small cross-sectional area. The atom beam at the second subsystem may be further laser cooled along the transverse axes. (Generally, the beam compression subsystem may include at least one laser beam. The beam compression subsystem may also include an arrangement of magnetic fields produced either by current carrying wires, permanent magnetic material or a combination of the two.)

As shown in FIG. 2A, the magneto-optical compressor 220 may be composed of four sets of permanent magnets 221, 222, 223, 224, a second set of magnets 225, 226, 227, 228, a third set of magnets 261, 262, 263, 264 and a fourth set of four magnets (not shown) which may create a quadrupole magnetic field. The magneto-optical compressor 220 may produce a gradient which is equal in magnitude and opposite in sign along each of the transverse axes. Two pairs of counter-propagating laser beams 241, 242, 243, 244 may fill the interior of the magneto-optical compressor 220 through which the atom beam passes. These counter-propagating beams 241, 242, 243, 244 may be aligned with one of the transverse axes of the atom beam. As is well known in the art of magneto-optical trapping, when the wavelength and polarization of the laser beams 241, 242, 243, 244 are correctly configured, the atoms in the neutral atom beam may be subject to a viscous and position-dependent force.

Within the magneto-optical compressor 220, the atom beam may be confined to a cross-sectional area close to the compressor's axis and proportional to the square root of the transverse magnetic field gradient at that particular axial position. A gradient of nearly 0 G/cm at the entrance of the magneto-optical compressor may aid in efficient capture of the atom beam, while a gradient of up to 900 G/cm at the strongest point may aid in tight confinement of the beam. The strength of the maximum gradient can be configured by changing the distance between the magnets. A magnetic shield 267 may aid in ensuring that the magnetic field is substantially zero beyond the aperture of the magneto-optical compressor 220 where the beam exits.

In lieu of the magneto-optical compressor 220 shown in FIG. 2A, beam compression may be performed by a hexapolar arrangement of magnets around the beam axis. This configuration of magnets may produce a magnetic field with a gradient that increases linearly with displacement from the beam axis. The magnetic field may act as a lens for the atoms in the beam. The focal length of the lens may depend on the magnet strength, the magnetic state of the atoms and the average axial beam velocity.

In another embodiment, in lieu of the hexapolar arrangement or the magneto-optical compressor described above, one or more laser-based lenses may be employed. When the laser wavelength is tuned appropriately, the lenses may be used to apply a force to atoms either toward or away from regions of high laser intensity.

An optical molasses having laser beams 271, 272, 273, 274 may be used to collimate the beam and lower the transverse temperature at an axial position where the transverse beam size is compressed. The optical molasses may be used in conjunction with any of the expressly mentioned beam compression embodiments.

The beam formation subsystem 210 and the beam compression subsystem 215 may be used to create a neutral beam with a very high brightness, according to the following formula:

$$\beta = \frac{eF}{4\pi^2 \varepsilon_x \varepsilon_y} \quad \text{(Equation 1)}$$

where $\beta$ is brightness, F is the beam's atomic flux and e is the electron charge. The variables $\epsilon_x$ and $\epsilon_y$ are the normalized root mean square emittances along the two transverse axes. For a beam with Gaussian spatial distribution characterized by a standard deviation $\sigma$ and Maxwellian velocity distribution characterized by a temperature T the normalized rms emittance can be written:

$$\varepsilon = \sigma \sqrt{\frac{k_B T}{2}} \quad \text{(Equation 2)}$$

Using estimates of performance for the first two subsystems of the present disclosure, F=$10^{10}$ atoms/s, $\sigma$=20 µm and T=10 µK (readily achievable for laser cooling of Cesium atoms) may yield $\beta \approx 2 \cdot 10^8$ A m$^{-2}$ srad$^{-1}$ eV$^{-1}$ for a neutral atom brightness.

The actual value achieved in any particular implementation of the embodiments may depend on the achieved flux out of the beam formation subsystem, the level of compression achieved by beam compression subsystem and the transverse temperature of the atom beam.

A photoionization subsystem may be incorporated into system for creating the charged particle beam. The atoms received from the beam compression subsystem may be photoionized by one or more laser beams and then accelerated by an axial electric field to form the charged particle beam. The products of the photoionization may be positive ions and electrons.

The photoionization and extraction subsystems may create a population of charged particles having a brightness that is close to the atom beam brightness. Using the system of the present disclosure, efficient ionization of neutral atoms in the atom beam may be achieved. This efficiency may be accomplished by using elements in the beam formation subsystem that produce atom beams with mean beam velocities that are lower than those produced by the atomic vapor source.

Figure 2B:
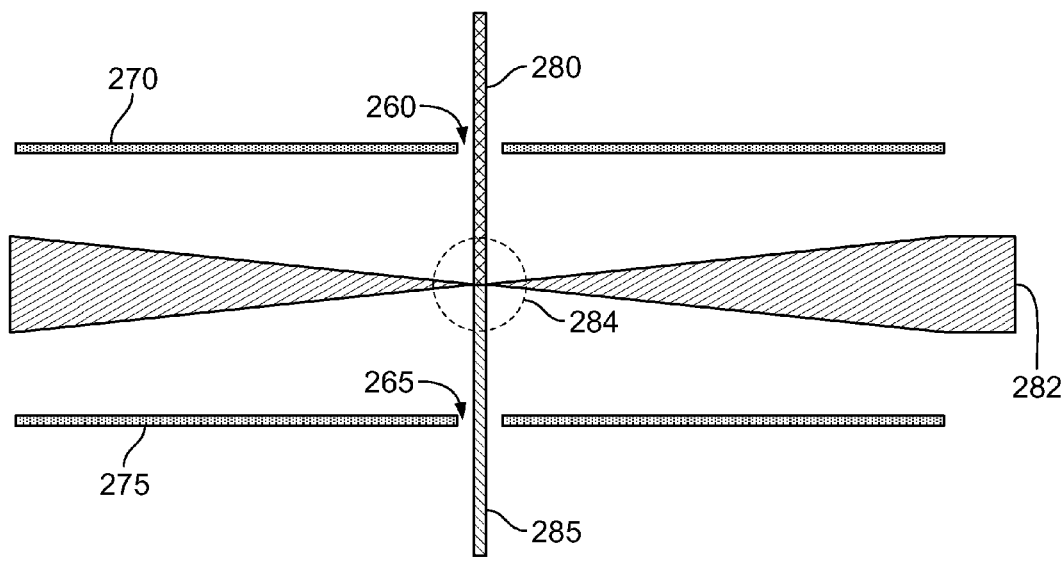
FIG. 2B illustrates a side view of photoionization and extraction subsystems in accordance with embodiments of the present disclosure.
Figure 2C:
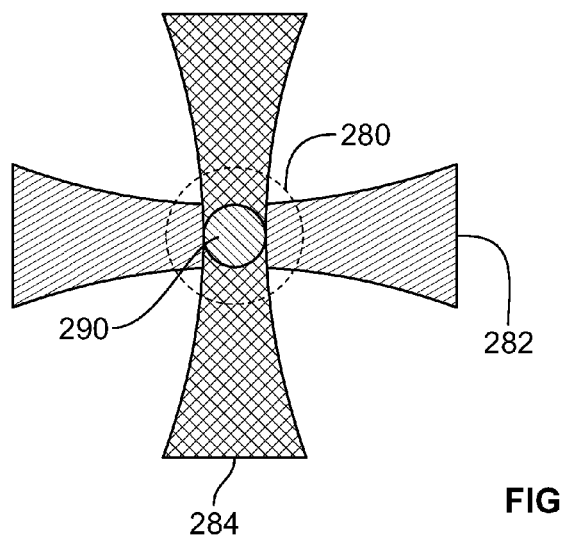
FIG. 2C illustrates a top view of a photoionization subsystem in accordance with one embodiment of the present disclosure.

Referring now to FIG. 2B, illustrated are side views of photoionization and extraction subsystems in accordance with embodiments of the present disclosure. The elements that combine to provide for photoionization may include laser beams 282, 284 (directed into the page) which may have differing frequencies. As shown in FIG. 2B, the beams 282, 284 may intersect each other and the atom beam 280. Either or both of the laser beams 282, 284 may be retro-reflected back on itself to form a counter-propagating beam. FIG. 2C illustrates a top view of a photoionization subsystem of FIG. 2B in accordance with one embodiment of the present disclosure. Here, the location of the ionization region 290 is shown. The two laser frequencies together may operate to ionize the neutral atoms in the beam only in the region where the beams intersect, thus allowing precise control over the size and shape of the charged particle source. One of the laser beams may excite a strong internal transition in the atoms. This laser beam may be created from the same laser light source as the cooling light employed by the beam formation subsystem and the beam compression subsystem. The other laser beam may have a laser frequency selected so that the energy per photon is sufficient to ionize the atom from the internal state excited by the first laser.

The ionization laser beams may be arranged so that they select an axial velocity class of atoms from the atom beam received by the photoionization subsystem which will be preferentially converted into charged particles. Accordingly, both the mean axial velocity and axial velocity spread of atoms converted into charged particles can be modified, controlled, or selected in the photoionization subsystem. This technique may be used in conjunction with, or independently from, embodiments of the beam formation subsystem that produce atom beams with substantially modified axial velocity profiles.

The photoionization elements that are used in the photoionization subsystem may take on several forms. For example, the photoionization subsystem may include a laser driving a strong internal transition of the atoms in the beam. When this laser beam is situated at a non-normal angle relative to the atom beam, it may cause the atoms in the beam to experience a Doppler shift of the laser frequency that is dependent on the axial velocity. Depending on the frequency of the laser and the angle of the laser beam relative to the atom beam, atoms of a select velocity will be in resonance with the laser and have a relatively high probability of interacting with this laser. As the velocity of a particular atom differs from this select velocity, the atom will have a relatively low probability of interacting with this laser. Only those atoms interacting with this laser will ultimately be converted to charged particles in the photoionization subsystem. Therefore, the velocity selection of atoms converted to charged particles may occur in the photoionization subsystem by manipulating the orientation and frequency of the laser driving the strong internal transition.

In lieu of two laser beams, other quantities of beams may be used to aid in photoionization. However, it may be desirable that the sum total of energy per photon from all laser frequencies not be significantly larger than the minimum required for ionization since excess energy may cause the created ions and electrons to be transversely heated.

The ionization probability for atoms within the beam may be proportional to the ionization laser intensity multiplied by the transit time through the photoionization region. Accordingly, where an ionization laser has a fixed power, then the ionization probability may not be increased by spreading the laser over a longer axial length. The axial velocity of the atom beam may determine the interaction time between the neutral atoms and ionization lasers, and therefore may limit the ionization efficiency.

An extraction subsystem may be used in conjunction with the present system to create an electric field of defined magnitude and orientation in the vicinity of the population of charged particles generated by the photoionization subsystem. This electric field may accelerate the charged particles away from the ionization region. The chosen magnitude of the electric field employed may depend on the beam current and the atomic species being employed. For example, in order to mitigate the effects of Coulomb interactions in the ion beam, relatively stronger fields (e.g., >$10^5$ V/m) may be used when the ion source is generating larger beam currents or is using heavy atomic species. When Coulomb effects are not predicted to impact ion beam brightness, as may be the case when employing lower currents or lighter atomic species, lower magnitude electric fields (e.g., <$10^5$ V/m) may be used in order to minimize the chromatic energy spread in the generated beam.

Generally, the elements that make up the extraction subsystem may include an opening or aperture through which the atom beam enters the extraction subsystem. The extraction elements may also include an access mechanism that permits optical access to the atom beam for lasers comprising the photoionization subsystem, a plurality of electrodes which can be used to apply an electric field of defined magnitude and direction to charged particles created by the photoionization subsystem, and an opening or aperture through which the charged particle beam exits the extraction subsystem.

In the embodiment in FIG. 2B, the extraction subsystem 250 includes two planar electrodes 270, 275 with apertures 260, 265 bored through them. The atom beam 280 may enter through the aperture 260 in electrode 270. The photoionization lasers 282, 284 may have optical access to the atom beam 280 from the sides through the gap created by the separation between the first electrode 270 and the second electrode 275.

A voltage difference between electrode 270 and electrode 275 may create a substantially uniform electric field in the region of space where the photoionization lasers 282, 284 create charged particles. When operating as an ion source, electrode 270 may be maintained at a higher voltage than electrode 275, thereby creating an electric field which may direct an ion beam output 285 through the opening in electrode 275. In this mode of operation, an electron beam (not shown) of equivalent current to the ion beam output 285 may be directed through the opening in electrode 270. These electrons may be collected and employed as a feedback mechanism for the ion beam. Alternatively, a charged particle deflector may direct the electron beam to another electron beam focusing device. The voltages on the electrodes 270, 275 may be changed to allow the flow of ions and electrons to be reversed. By selecting the appropriate electric field polarity, the electron and/or ion beam may be directed toward the desired targets.

Figure 3:
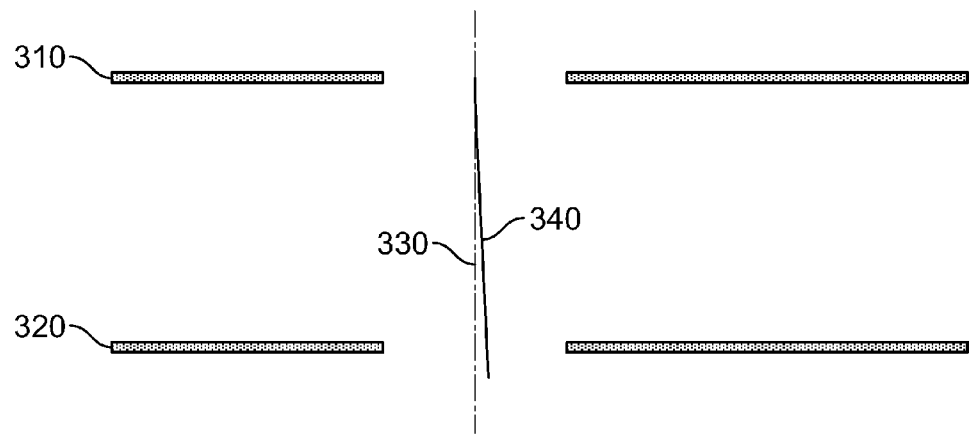
FIG. 3 illustrates a side view of an extraction subsystem showing a possible misalignment that could occur between the atom beam axis and the electric field created in the extraction subsystem.

The orientation of the electric field produced by the extraction subsystem relative to the atom beam may affect the brightness of the charged particle beam. Referring now to FIG. 3, illustrated is a side view of an extraction subsystem showing the possible misalignment that could occur between the atom beam axis 340 and the electric field 330 created in the extraction subsystem. If the electric field in the ionization region is at an angle θ with respect to the neutral atom beam that has an axial velocity spread $\Delta v_{axial}^{atom}$, then there may be an increase in the transverse velocity spread in the charged particle beam as follows:

$$\Delta v_{transverse}^{ion/electron} = \Delta v_{axial}^{atom} \sin(\theta). \quad \text{(Equation 4)}$$

This transverse velocity spread may effectively add to the transverse temperature of the beam. Since beam brightness is inversely proportional to the transverse temperature, constraints on the alignment of the beam direction to the electric field may be significantly eased for beams with low axial velocity spreads. This may allow lower temperature, and therefore, brighter beams to be formed and maintained with greater stability against misalignment than for beams with larger axial velocity spreads.

According to equation 4, the relative angle between the atom beam and the electric field in the extraction subsystem couples the axial velocity spread to the transverse velocity spread. The negative effects of this coupling may occur in systems that create charged particle beams by photoionizing cold atom beams in the presence of an electric field. These effects can be mitigated by minimizing the relative angle between the electric field and atom beam. Therefore, the methods described in the following paragraphs for precisely aligning the atom beam axis and electric field in the extraction subsystem may have utility in systems in which a high brightness charged particle beam is produced by photoionizing a cold atom beam in the presence of an electric field.

In both of the two basic approaches described herein for aligning the atom beam with the electric field and minimizing the relative angle, the orientation of either the atom beam axis or the electric field is controlled.

Several methods may be used to control the orientation of the atom beam axis. One method is mechanically tilting the entire apparatus that produces the cold atom beam. Another method is mechanically tilting the portion of the system that determines the direction of the atom beam when it encounters the photoionization subsystem. As an example, referring back to FIG. 2A, this control can be achieved by tilting the entire apparatus shown or the portion of the apparatus where the optical molasses and its laser beams 271, 272, 273, 274 are disposed.

The direction of the atom beam may also be controlled through the application of laser fields or a combination of laser fields and magnetic fields that impart a velocity component to the atoms in the beam that is transverse to the axis of the beam. As an example, using the embodiment shown in FIG. 2A, a uniform magnetic field applied along the axis of the laser beams 271, 272, 273, 274 forming the molasses may introduce a drift velocity to the atoms along the direction of the magnetic field with magnitude proportional to the applied field strength. When changing the orientation of the atom beam, it may be useful to choose the eucentric point of spatial transformation applied to the atom beam axis to coincide with the centroid of the volume of space in which charged particles are created by the photoionization subsystem. This can be done, for example, by translating the atom beam so that the beam intersects the centroid given an applied angular transformation.

Several methods may be used to control the orientation of the electric field in the volume of space where charged particles are created in the photoionization subsystem. In general, the electric fields may be produced by electrodes of a given spatial arrangement and applied voltages, and this configuration can be designed to allow for controllable orientation of the electric field produced.

Referring back to FIG. 3, the direction of the electric field formed between the two parallel plates 310, 320 may be normal to the surface of the plates (extractor axis 330). The direction of the electric field can be varied by mechanically tilting both plates 310, 320 such that the extractor axis 330 lies along the desired direction.

In another embodiment, the electrodes may be segmented about a plane containing the extractor axis and centered on the photoionization subsystem allowing the electrode segments to be maintained at differing voltages in order to produce an electric field component transverse to the extractor axis that controls the direction of the resultant field.

Figure 4:
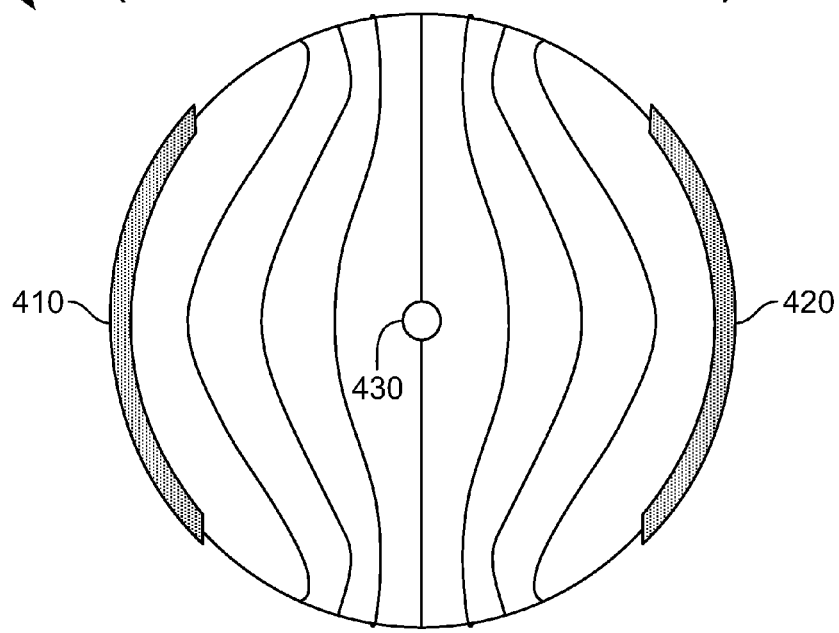
FIG. 4 illustrates an extraction electrode in an extraction subsystem according to one embodiment of the present disclosure.

Referring now to FIG. 4, illustrated is an extraction electrode in an extraction subsystem according to one embodiment of the present disclosure. In this embodiment, the extraction electrode provides for application of a small transverse electric field component. This component may be used to align the resultant electric field in the extraction subsystem to the electric field in the atom beam axis. Electrode 400 may be comprised of an electrically resistive material so that a voltage difference applied across the electrode 400 can be used to create an electric field transverse to the extractor axis and control the orientation of the resultant field. Electrode 400 also includes electrical contacts 410, 420 through which a voltage may be applied and aperture 430 through which a beam of atoms or charged particles may pass.

Chromatic aberrations may negatively impact the achievable spot size in any ion-optical column. Therefore, it may be desirable that the axial energy spread of the beam produced is minimized. In accordance with the present disclosure, the lower limit of the energy spread may be equal to the spread in axial energies in the atom beam. For an atom beam that may be produced by the beam formation subsystem with a velocity spread of three meters per second (3 m/s), the intrinsic charged particle energy spread after photoionization will be much less than one milli-electron volt (meV). More realistically, the energy spread ΔU will be $$\Delta U = \sigma_z eE \quad \text{(Equation 5)}$$

where E is the electric field at the location where the charged particles are created, e is the electron charge and $\sigma_z$ is the axial extent of the ionization laser. The axial extent of the ionization laser $\sigma_z$ can be as small as a few microns by employing a tightly focused ionization laser. However, the electric field must be kept large enough that charged particles are removed from the source volume before their Coulomb interactions with subsequently created charged particles leads to heating and a loss of brightness.

While the specification describes particular embodiments of the present invention, those of ordinary skill can devise variations of the present invention without departing from the inventive concept.

We claim:

1. A system for producing a charged particle beam from a photoionized cold atom beam, comprising:
   an atomic vapor source configured to generate a vapor of neutral atoms;
   a beam formation subsystem configured to receive atoms from the atomic vapor source and to produce an atom beam that includes said received atoms, the beam formation subsystem being further configured to control axial and transverse velocity distributions of the produced atom beam;
   a beam compression subsystem configured to receive the produced atom beam and to spatially compress said beam along each transverse axis in order to reduce the cross-sectional area of said produced beam and to reduce a velocity spread of said produced beam along directions transverse to the beam's direction of propagation;
   a photoionization subsystem configured to receive neutral atoms from the compressed atom beam and to direct at least one beam of laser light onto at least a portion of the neutral atoms in the compressed atom beam, thereby producing ions and electrons;
   an extraction subsystem configured to generate an electric field at the location of the produced ions and electrons, thereby producing an ion beam propagating in a first direction and an electron beam propagating in substantially the opposite direction; and
   a vacuum chamber evacuated to less than about $10^{-6}$ millibar, said vacuum chamber configured to contain at least the produced atom beam, the compressed atom beam, the ion beam and the electron beam.

2. The system of claim 1, wherein the neutral atoms are selected from the group consisting of Li, Na, K, Rb, Cs, Fr, Mg, Ca, Sr, Ba, Cr, Ag, Er, Si, P, Sb, Ne, Ar, Kr, and Xe atoms.

3. The system of claim 1, wherein the atomic vapor source includes a heated container or a nozzle from which the atomic vapor is discharged.

4. The system of claim 1, wherein the beam formation subsystem includes a two-dimensional magneto-optical trap.

5. The system of claim 4, further comprising:
   a beam pair along a third axis.

6. The system of claim 1, wherein the beam formation subsystem includes:
   a laser collimation device configured to reduce the velocity of the atomic vapor along two spatial dimensions, and to produce the atom beam that includes said received atoms; and
   a Zeeman slower device configured to receive the produced atom beam from the laser collimation device and reduce the velocity of the produced atom beam, said velocity being reduced along the direction of propagation for the atom beam.

7. The system of claim 1, wherein the beam formation subsystem includes a low velocity intense source.

8. The system of claim 1, wherein the beam compression subsystem includes:
   a plurality of magnets disposed radially around the atom beam axis in order to produce a hexapolar magnetic field; and
   a laser collimation device that has at least two laser beam pairs configured to receive the atom beam from the magnets and produce a beam that has a reduced velocity in the directions transverse to the beam's direction of propagation.

9. The system of claim 1, wherein the beam compression subsystem includes laser lenses.

10. The system of claim 1, wherein the beam compression subsystem includes a magneto-optical compressor.

11. The system of claim 10, wherein the beam compression subsystem includes optical molasses.

12. The system of claim 1, wherein the photoionization subsystem includes two pairs of counter-propagating laser beams, the beams intersecting each other and at least a portion of the compressed atom beam.

13. The system of claim 12, wherein the first beam pair has a wavelength configured to excite the atoms composing the atom beam from their ground to internal excited state, and wherein the second beam pair has a wavelength configured to ionize the excited atoms from the first beam pair.

14. The system of claim 1, wherein the at least one laser beam has a frequency and orientation configured to excite atoms within a specified velocity band in the compressed atom beam.

15. The system of claim 1, wherein the extraction subsystem includes a pair of electrodes, each electrode having an aperture therethrough, and an applied voltage through each said aperture.

16. A method for producing a charged particle beam from a photoionized cold atom beam, comprising the steps of:
   generating a vapor of neutral atoms,
   receiving atoms and producing an atom beam that includes said received atoms;
   controlling axial and transverse velocity distributions of the produced atom beam;
   evacuating a vacuum chamber to less than about $10^{-6}$ millibar, said vacuum chamber configured to contain at least the produced atom beam, the compressed atom beam, the ion beam and the electron beam;
   receiving the produced atom beam and spatially compressing said beam along each transverse axis in order to reduce the cross-sectional area of said produced beam and to reduce a velocity spread of said produced beam along directions transverse to the beam's direction of propagation;
   receiving neutral atoms and directing at least one beam of laser light onto at least a portion of the neutral atoms in the atom beam, thereby producing ions and electrons; and
   generating an electric field at the location of the produced ions and electrons, thereby producing a beam of ions traveling in a first direction and a beam of electrons traveling in substantially the opposite direction.

17. The method of claim 16, wherein the step of receiving atoms and producing an atom beam that includes said received atoms is performed by a two-dimensional magneto-optical trap having a pusher beam.

18. The method of claim 16, wherein the step of receiving the produced atom beam and spatially compressing said beam along each transverse axis is performed by a magneto-optical compressor.

19. The method of claim 16, wherein the step of receiving neutral atoms from the beam compression subsystem and directing at least one beam of laser light onto at least a portion of the neutral atoms in the atom beam is performed by two pairs of counter-propagating laser beams, the beams intersecting each other and at least a portion of the atom beam received, and wherein the first beam pair has a wavelength configured to excite the atoms composing the atom beam from their ground to internal excited state, and wherein the second beam pair has a wavelength configured to ionize the excited atoms from the first beam pair.

20. A system for producing a charged particle beam from a photoionized cold atom beam, comprising:
- an atomic vapor source configured to produce a vapor of neutral atoms;
- a beam formation subsystem having one or two apertures, said one or two apertures having a size and location with respect to the atomic vapor source that is configured to selectively eliminate atoms from the vapor that have a transverse velocity above a chosen threshold with respect to the atom beam axis;
- a beam compression subsystem configured to receive the produced atom beam and to spatially compress said beam along each transverse axis in order to reduce the cross-sectional area of said produced beam and to reduce a velocity spread of said produced beam along directions transverse to the beam's direction of propagation;
- a photoionization subsystem configured to receive neutral atoms from the compressed atom beam and to direct at least one beam of laser light onto at least a portion of the neutral atoms in the compressed atom beam, thereby producing ions and electrons, wherein at least one of the at least one laser beam of light has a frequency and orientation configured to excite a group atoms in the atom beam within a predetermined axial velocity band;
- an extraction subsystem configured to generate an electric field at the location of the produced ions and electrons, thereby producing an ion beam propagating in a first direction and an electron beam propagating in substantially the opposite direction; and
- a vacuum chamber evacuated to less than about $10^{-6}$ millibar, said vacuum chamber configured to contain at least the produced atom beam, the compressed atom beam, the ion beam and the electron beam.

* * * * *